United States Patent
Lee et al.

(10) Patent No.: US 7,288,818 B2
(45) Date of Patent: Oct. 30, 2007

(54) ORGANIC THIN FILM TRANSISTOR WITH LOW GATE OVERLAP CAPACITANCE AND FLAT PANEL DISPLAY INCLUDING THE SAME

(75) Inventors: Hun-Jung Lee, Suwon-si (KR); Jae-Bon Koo, Suwon-si (KR)

(73) Assignee: Samsung SDI Co., Ltd. (KR)

( * ) Notice: Subject to any disclaimer, the term of this patent is extended or adjusted under 35 U.S.C. 154(b) by 0 days.

(21) Appl. No.: 11/230,293

(22) Filed: Sep. 19, 2005

(65) Prior Publication Data
US 2006/0060855 A1     Mar. 23, 2006

(30) Foreign Application Priority Data
Sep. 20, 2004    (KR)    ............... 10-2004-0075095

(51) Int. Cl.
*H01L 27/12* (2006.01)
(52) U.S. Cl. .................. 257/347; 257/40; 257/213; 257/288; 257/E51.005; 438/142; 438/149
(58) Field of Classification Search ............ None
See application file for complete search history.

(56) References Cited

U.S. PATENT DOCUMENTS 6,433,359 B1 * 8/2002 Kelley et al. .............. 257/40
6,661,024 B1 * 12/2003 Zhang et al. .............. 257/40
2004/0012017 A1 * 1/2004 Nagayama ................. 257/40

FOREIGN PATENT DOCUMENTS

| JP | 2-224275 A | * | 9/1990 |
| JP | 8-78684 | | 3/1996 |
| JP | 8-191162 | | 7/1996 |

OTHER PUBLICATIONS

Office Action issued by the Korean Patent Office on Jun. 30, 2006.

* cited by examiner

*Primary Examiner*—Leonardo Andujar
*Assistant Examiner*—Kevin Quinto
(74) *Attorney, Agent, or Firm*—Knobbe, Martens, Olson & Bear LLP

(57) ABSTRACT

Provided are an organic thin film transistor, a flat panel display device and methods of manufacturing these. The organic thin film transistor includes: source and drain electrodes and an organic semiconductor layer formed on a surface of a substrate; a gate electrode insulated from the source and drain electrodes and the organic semiconductor layer; wherein a thickness of at least a portion of the gate insulator above both the source and drain electrodes is larger than a thickness of at least a portion of the gate insulator above the channel region of the organic semiconductor layer.

18 Claims, 4 Drawing Sheets

ORGANIC THIN FILM TRANSISTOR WITH LOW GATE OVERLAP CAPACITANCE AND FLAT PANEL DISPLAY INCLUDING THE SAME

CROSS-REFERENCE TO RELATED PATENT APPLICATION

This application claims the benefit of Korean Patent Application No. 10-2004-0075095, filed on Sep. 20, 2004, in the Korean Intellectual Property Office, the disclosure of which is incorporated herein in its entirety by reference.

BACKGROUND OF THE INVENTION

1. Field of the Invention

The present invention relates to an organic thin film transistor and a flat panel display device including the same, and more particularly, to an organic thin film transistor capable of precisely transmitting signals, the operation thereof and a flat panel display device including the same.

2. Description of the Related Art

Flat panel display devices, such as liquid crystal display devices, organic electroluminescent display devices, inorganic electroluminescent display devices, and the like, include thin film transistors (TFTs). A TFT is used as a switching device controlling the operation of a pixel or as a driving device for driving a pixel.

The TFT includes a semiconductor layer having source and drain regions doped with a high-concentration impurity and a channel region formed between the source region and the drain region, a gate electrode insulated from the semiconductor layer and disposed above the channel region, and source and drain electrodes respectively contacting the source and drain regions.

Flat display devices have become thin and flexible. In order to obtain a flexible flat display device, a plastic substrate is used instead of a glass substrate. However, the use of a plastic substrate requires a low temperature process. Therefore, a conventional transistor composed of polysilicon cannot be used.

In order to solve this problem, organic semiconductors have been developed. Organic semiconductors can be processed at low temperatures such that TFTs can be manufactured at low costs.

FIG. 1 is a sectional view of a conventional organic TFT. Referring to FIG. 1, source and drain electrodes 11, an organic semiconductor layer 12, and a gate electrode 14 are formed on a surface of a substrate 10. The source and drain electrodes 11 are insulated from the gate electrode 14 by a gate insulator 13. The insulator 13 has a thickness within a predetermined range. When the thickness of the gate insulator 13 is too great, an interaction between the channel region of the organic semiconductor layer 12 and the gate electrode is not consistent across the entire channel region, thus decreasing operating performance. On the other hand, when the thickness of the gate insulator 13 is too small, parasitic capacitance may be increased between the gate electrode 14 and both the source and drain electrodes 11 in regions indicated by "Ac". The capacitance between the gate electrode 14 and both the source and drain electrodes 11 is given by $$C = k \frac{A_r}{d}$$

where k is the dielectric constant of the insulator 13, Ar is the area where the source and drain electrodes 11 and the gate electrode 14 overlap, and d is the distance between the source and drain electrodes 11 and the gate electrode 14. For example, as the thickness the gate insulator 13 decreases, C increases, resulting in a parasitic capacitance between the source and drain electrodes 11 and the gate electrode 14, which is undesired. The parasitic capacitance causes a signal delay such that the operating speed of a device becomes lower. Since flat display devices must display gradation with accuracy and quick response, such a signal delay must be overcome.

SUMMARY OF CERTAIN INVENTIVE EMBODIMENTS

According to a first embodiment, there is provided an thin transistor film including: source and drain electrodes and an semiconductor layer formed on a substrate, the semiconductor layer comprising a channel region between the source and drain electrodes, a gate electrode insulated from the source and drain electrodes and the semiconductor layer, and a gate insulator formed at least between the gate electrode and each of the source and drain electrodes and the channel region of the semiconductor, the thickness of at least a portion of the gate insulator between the gate electrode and each of the source and drain electrodes being greater than the thickness of at least a portion of the gate insulator between the gate electrode and the channel region of the semiconductor.

The source and drain electrodes may each form an ohmic-contact with the semiconductor layer, and may be composed of at least an element selected from the group consisting of Au, Au/Ti, Au/Cr, Pt, Pt/Pd, and Ni.

The gate insulator may comprise a layer composed of at least a compound selected from the group consisting of $SiO_2$, $SiN_x$, $Al_2O_3$, $Ta_2O_5$, BST, PZT, poly methylmethacrylate (PMMA), polystyrene (PS), phenol-containing polymers, acryl-containing polymers, imide-containing polymers including polyimide, arylether-containing polymers, amide-containing polymers, fluorine-containing polymers, polymers containing p-xylene, vinyl alcohol-containing polymers, and parylene.

The semiconductor layer may be composed of at least a compound selected from the group consisting of pentacene, tetracene, anthracene, naphthalene, α-6-thiophene, perylene and derivatives thereof, rubrene and derivatives thereof, coronene and derivatives thereof, perylenetetracarboxylic diimide and derivatives thereof, perylenetetracarboxylic dianhydride and derivatives thereof, polythiophene and derivatives thereof, polyparaphenylenevinylene and derivatives thereof, polyparaphenylene and derivatives thereof, polyflorene and derivatives thereof, polythiophenevinylene and derivatives thereof, polythiophene-heteroaromatic ring copolymer and derivatives thereof, oligoacene of naphthalene and derivatives thereof, oligothiophene of α-5-thiophene and derivatives thereof, a metal-containing phthalocyanine or metal-free phthalocyanine and derivatives thereof, pyromelitic dianhydride and derivatives thereof, pyromelitic diimide and derivatives thereof, perylenetetracarboxylic acid dianhydride and derivatives thereof, perylenetetracarboxylic diimide and derivatives thereof, naphthalene tetracarboxylic acid diimide and derivatives thereof, and naphthalene tetracarboxylic acid dianhydride and derivatives thereof.

At least a portion of the gate insulator may be tapered.

According to a another embodiment, there is provided a flat display device comprising: a substrate having a display region, an thin film transistor, and a pixel layer formed on the display region, the thin film transistor comprising: source and drain electrodes and an semiconductor layer formed on a substrate, the semiconductor layer comprising a channel region between the source and drain electrodes, a gate electrode insulated from the source and drain electrodes and the semiconductor layer, and a gate insulator formed at least between the gate electrode and each of the source and drain electrodes and the channel region of the semiconductor, the thickness of at least a portion of the gate insulator between the gate electrode and each of the source and drain electrodes being greater than the thickness of at least a portion of the gate insulator between the gate electrode and the channel region of the semiconductor.

The source and drain electrodes may each form an ohmic-contact with the semiconductor layer, and may be composed of at least an element selected from the group consisting of Au, Au/Ti, Au/Cr, Pt, Pt/Pd, and Ni.

The gate insulator may comprise at least a layer composed of at least a compound selected from the group consisting of $SiO_2$, SiNx, $Al_2O_3$, $Ta_2O_5$, BST, PZT, poly methylmethacrylate (PMMA), polystyrene (PS), phenol-containing polymers, acryl-containing polymers, imide-containing polymers, arylether-containing polymers, amide-containing polymers, fluorine-containing polymers, polymers containing p-xylene, vinyl alcohol-containing polymers, and parylene.

The semiconductor layer may be composed of at least a compound selected from the group consisting of pentacene, tetracene, anthracene, naphthalene, α-6-thiophene, perylene and derivatives thereof, rubrene and derivatives thereof, coronene and derivatives thereof, perylenetetracarboxylic diimide and derivatives thereof, perylenetetracarboxylic dianhydride and derivatives thereof, polythiophene and derivatives thereof, polyparaphenylenevinylene and derivatives thereof, polyparaphenylene and derivatives thereof, polyflorene and derivatives thereof, polythiophenevinylene and derivatives thereof, polythiophene-heteroaromatic ring copolymer and derivatives thereof, oligoacene of naphthalene and derivatives thereof, oligothiophene of α-5-thiophene and derivatives thereof, a metal-containing phthalocyanine or metal-free phthalocyanine and derivatives thereof, pyromelitic dianhydride and derivatives thereof, pyromelitic diimide and derivatives thereof, perylenetetracarboxylic acid dianhydride and derivatives thereof, perylenetetracarboxylic diimide and derivatives thereof, naphthalene tetracarboxylic acid diimide and derivatives thereof, and naphthalene tetracarboxylic acid dianhydride and derivatives thereof.

At least a portion of the gate insulator may be tapered.

According to a another embodiment, there is provided a method of manufacturing an thin film transistor, the method comprising: forming source and drain electrodes on a substrate, forming above the source and drain electrodes an semiconductor layer comprising a channel region between the source and drain electrodes, forming a first gate insulator above the semiconductor layer, forming a second gate insulator above the first gate insulator, wherein the thickness of at least a portion of the second gate insulator between the gate electrode and each of the source and drain electrodes is greater than the thickness of at least a portion of the second gate insulator between the gate electrode and the channel region, and forming a gate electrode above at least the channel region.

Forming the second gate insulator may comprise: forming the second gate insulator on substantially the entire upper surface of the first gate insulator, and removing at least a portion of the second gate insulator above the channel region of the semiconductor layer.

Removing at least a portion of the second gate insulator may comprise using a laser beam.

Removing at least a portion of the second gate insulator may comprise masking and etching.

According to a another embodiment, there is provided a method of manufacturing an thin film transistor, the method comprising: forming source and drain electrodes above a surface of a substrate, forming above the source and drain electrodes an semiconductor layer comprising a channel region between the source and drain electrodes, forming a gate insulator above the semiconductor layer, wherein the thickness of at least a portion of the gate insulator between the gate electrode and each of the source and drain electrodes is greater than the thickness of at least a portion of the gate insulator between the gate electrode and the channel region, and forming a gate electrode above at least the channel region.

Forming the gate insulator may further comprise: forming the gate insulator on substantially the entire surface of the semiconductor layer, and removing at least a portion of the gate insulator above the channel region.

Removing at least a portion of the second gate insulator may comprise using a laser beam.

Removing at least a portion of the second gate insulator may comprise masking and etching.

BRIEF DESCRIPTION OF THE DRAWINGS

The above and other features and advantages of certain inventive aspects are discussed with further detailed exemplary embodiments with reference to the attached drawings in which.

DETAILED DESCRIPTION OF CERTAIN INVENTIVE EMBODIMENTS

Certain embodiments will now be described more fully with reference to the accompanying drawings, in which exemplary embodiments of the invention are shown.

Figure 1:
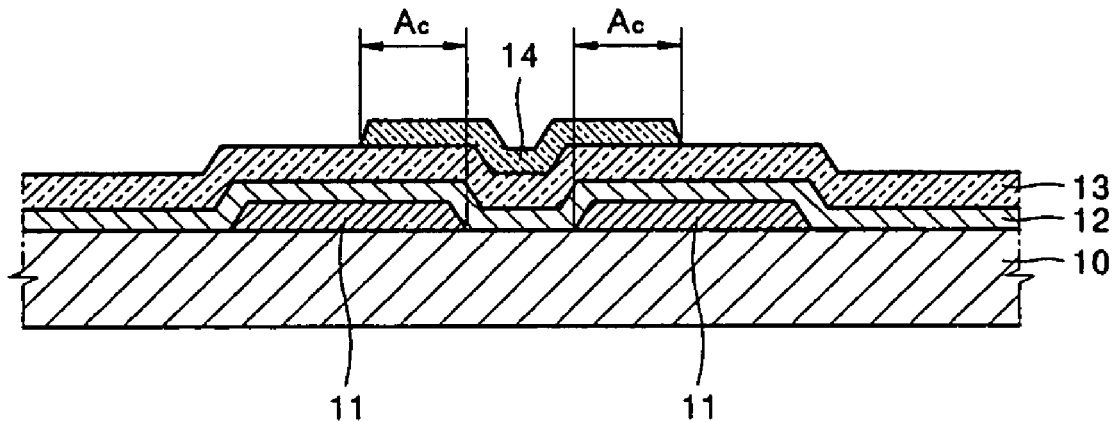
FIG. 1 (PRIOR ART) is a sectional view of a conventional organic thin film transistor.
Figure 2A:
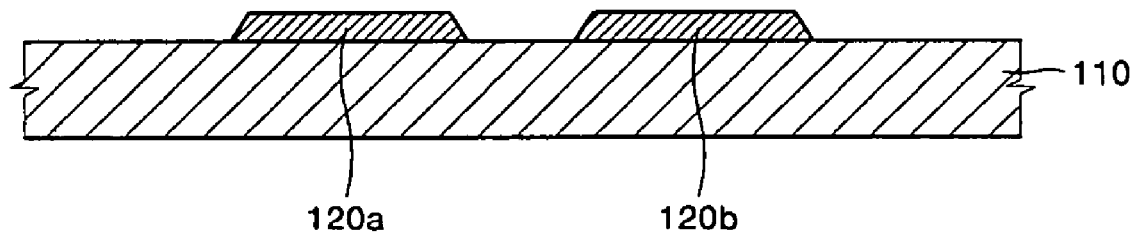
FIGS. 2A through 2G are sectional views illustrating a method of manufacturing an organic thin film transistor according to an embodiment.

FIGS. 2A through 2G are sectional views illustrating a method of manufacturing an organic thin film transistor according to an embodiment. Referring to FIG. 2A, a conducting layer is formed on a surface of a substrate 110 and source and drain electrodes 120a and 120b are formed by patterning the conducting layer.

The substrate 110 may be composed of glass or plastic or another suitable material or combination of materials. For example, the plastic may be polyethylene terephthalate (PET), polyethylene naphthalate (PEN), polyether sulfone (PES), polyether imide, polyphenylene sulfide (PPS), polyallylate, polyimide, polycarbonate (PC), cellulose triacetate (TAC), cellulose acetate propinonate (CAP), or the like.

Conducting materials composing the source and drain electrodes 120a and 120b may be selected in consideration of at least a desired ohmic contact with an organic semiconductor. For example, Au, Au/Ti, Au/Cr, Pt, Pt/Pd, Ni, or the like can be used. If needed, a buffer layer (not shown) may be further formed to prevent damage to the substrate 110 when the source and drain electrodes 120a and 120b are manufactured.

Figure 2B:
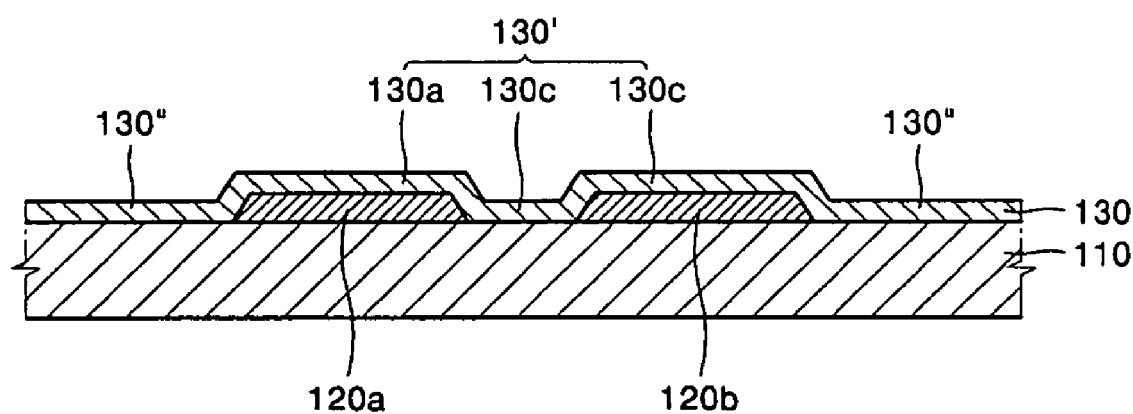

Referring to FIG. 2B, after the source and drain electrodes 120a and 120b are formed, an organic semiconductor layer 130 covers the source and drain electrodes 120a and 120b. The semiconductor layer 130 may be composed of at least a compound selected from pentacene, tetracene, anthracene, naphthalene, α-6-thiophene, perylene and derivatives thereof, rubrene and derivatives thereof, coronene and derivatives thereof, perylenetetracarboxylic diimide and derivatives thereof, perylenetetracarboxylic dianhydride and derivatives thereof, polythiophene and derivatives thereof, polyparaphenylenevinylene and derivatives thereof, polyparaphenylene and derivatives thereof, polyflorene and derivatives thereof, polythiophenevinylene and derivatives thereof, polythiophene-heteroaromatic ring copolymer and derivatives thereof, oligoacene of naphthalene and derivatives thereof, oligothiophene of α-5-thiophene and derivatives thereof, a metal-containing phthalocyanine or metal-free phthalocyanine and derivatives thereof, pyromelitic dianhydride and derivatives thereof, pyromelitic diimide and derivatives thereof, perylenetetracarboxylic acid dianhydride and derivatives thereof, perylenetetracarboxylic diimide and derivatives thereof, naphthalene tetracarboxylic acid diimide and derivatives thereof, and naphthalene tetracarboxylic acid dianhydride and derivatives thereof. Other materials may also be used.

As used herein the term "derivatives" refers to substituents comprising at least one of 1-4 fluoro, chloro, bromo, or iodo groups, an amino group, a carboxy group, a $C_1$-$C_6$ carboxy ester group, an amido group, a $C_1$ to $C_6$ amido group, a hydroxyl group, a $C_1$ to $C_6$ alkyl group, a $C_1$ to $C_6$ alkenyl group, a phenyl group, a substituted phenyl group, a phenyloxy group, a $C_1$ to $C_6$ alkylphenyl group, a $C_1$ to $C_6$ alkyl substituted phenyl group, a $C_1$ to $C_6$ acyloxy group, and the like.

The organic semiconductor layer 130 includes an active region 130' and an inactive region 130". The active region 130' is defined as the portion of the organic semiconductor layer 130 disposed above and between the underlying source and drain electrodes 120a and 120b, and the inactive region 130" is defined as the remaining portion of the organic semiconductor layer 130. The active region 130' includes a source region 130a, a drain region 130b, and a channel region 130c. The inactive region 130" is disposed outside the active region 130'.

Figure 2C:
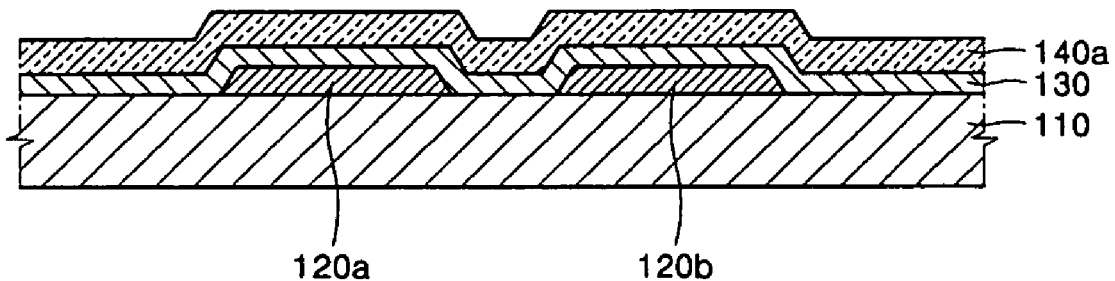

After the organic semiconductor layer 130 is formed, a plurality of insulators are formed on the organic semiconductor layer 130. Referring to FIG. 2C, a first gate insulator 140a is formed on the organic semiconductor layer 130. A material composing the first gate insulator 140a may be selected in consideration of at least desired adherence with the underlying organic semiconductor layer 130 and ease of manufacturing. The first gate insulator 140a may include an inorganic insulator or a polymer organic insulator deposited by spinning or the like. An inorganic insulator may be formed by, for example, sputtering at least a compound selected from $SiO_2$, $SiN_x$, $Al_2O_3$, $Ta_2O_5$, BST, and PZT. In some embodiments other such compounds may also be used.

The polymer organic insulator may be formed by, for example, spinning at least a compound selected from poly methylmethacrylate (PMMA), polystyrene (PS), phenol-containing polymers, acryl-containing polymers, imide-containing polymers, aryl ether-containing polymers, amide-containing polymers, fluorine-containing polymers, polymers containing p-xylene, vinyl alcohol-containing polymers, and parylene. In some embodiments other such compounds and methods of manufacturing may also be used.

Figure 2D:
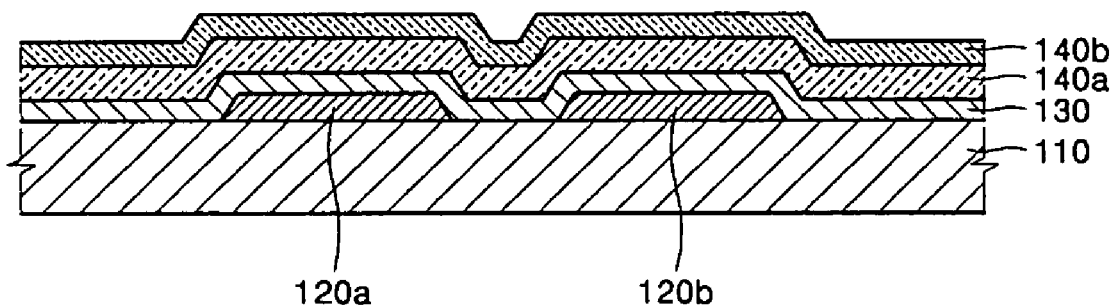

Referring to FIG. 2D, a second gate insulator 140b is formed on a surface of the first gate insulator 140a. The second gate insulator 140b may be composed of the same materials composing the first gate insulator 140a. However, the first gate insulator 140a and the second gate insulator 140b may be composed of different materials. This helps to prevent pin holes and/or vias that may be grown when the first and second gate insulators 140a and 140b are formed from adversely affecting the insulating ability of the insulators 140a and 140b. For example, when the first gate insulator 140a is composed of an organic polymer insulating material, the second gate insulator 140b may be composed of inorganic insulating material, or vice versa.

Figure 2E:
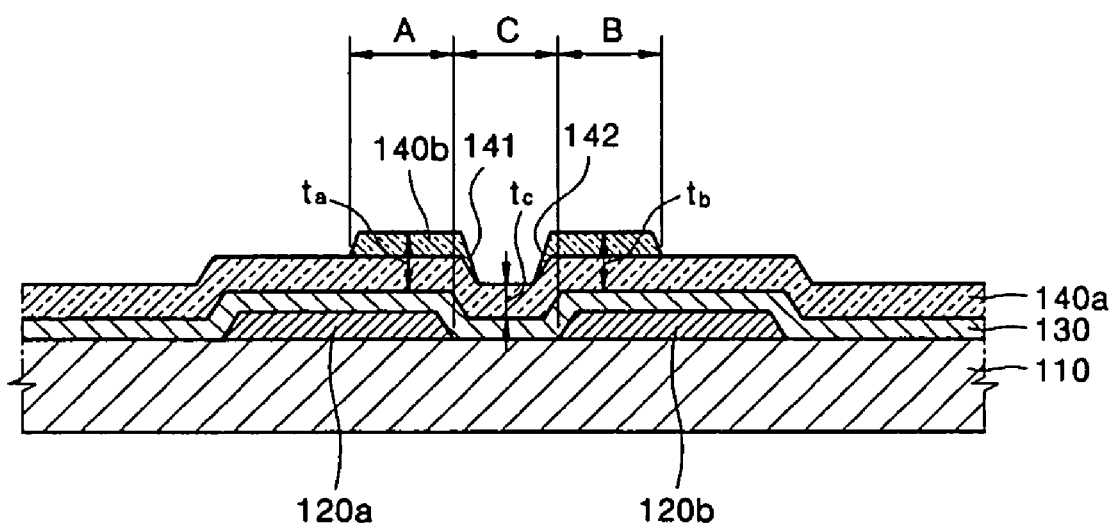

Referring to FIG. 2E, the second gate insulator 140b formed on the surface of the first gate insulator 140a may have a varying thickness. That is, the thickness of at least a portion of the second gate insulator 140b disposed above the source and drain electrodes 120a and 120b and below a gate electrode 150 to be formed later is greater than the thickness of at least a portion of the second gate insulator 140b disposed below the gate electrode 150 (not shown) and between the source and drain electrodes 120a and 120b. That is, referring to FIG. 2E, the second gate insulator 140b is patterned such that each of the thicknesses ta and tb of the second gate insulator 140b disposed above the source electrode 120a and the drain electrode 120b, respectively, is greater than the thickness tc of the second gate insulator 140b disposed above the channel region of the organic semiconductor layer 130.

In order to provide different thicknesses ta, tb, and tc of the second gate insulator 140b, the second gate insulator 140b can be patterned using various methods, some of which will be discussed herein. In order to ensure an easy manufacturing process and low manufacturing costs, the second gate insulator 140b can be pattered by etching, or layer ablation in which a laser beam is used. Formation of layers on the first and second gate insulators 140a and 140b may be difficult due to the non-planar structure. In order to solve this problem, the intensity of the laser beam can be controlled such that portions of the second gate insulator 140b are selectively removed. As a result the region between a remaining portion and a removed portion of the second gate insulator 140b is tapered. For example, in FIG. 2E, tapered portions 141 and 142 are formed by controlling the intensity of the laser beam radiated on the second gate insulator 140b.

Although the second gate insulator 140b according to one embodiment is formed by forming a gate insulator on the entire upper surface of the first gate insulator 140a and then patterning the gate insulator 140b, the second gate insulator 140b can be formed using other methods. For example, the desired pattern in the second gate insulator 140b can be formed by masking and etching. In addition, referring to FIG. 2G, a single gate insulator 140 instead of a plurality of gate insulators can be used. In this case, the gate insulator 140 is formed by masking such that the thickness of a portion of the gate insulator 140 disposed below the gate electrode 150 and above source and drain regions is greater than the thickness of a portion of the gate insulator 140 disposed above the channel region of the organic semiconductor layer 130. Alternatively, the gate insulator 140 can be formed by forming a gate insulator on an entire upper surface of an organic semiconductor layer and then removing at least a portion of the gate insulator disposed above the channel region of the organic semiconductor layer 130.

Figure 2F:
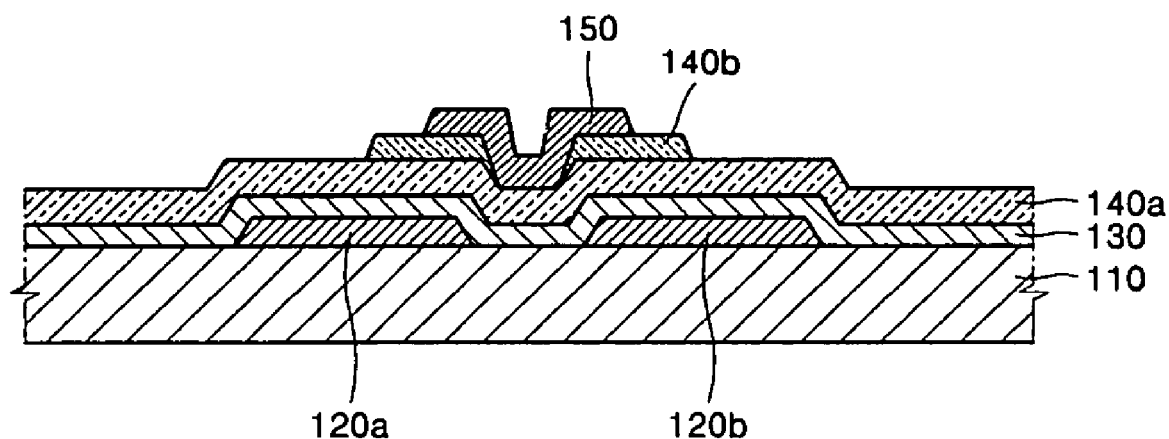
Figure 2G:
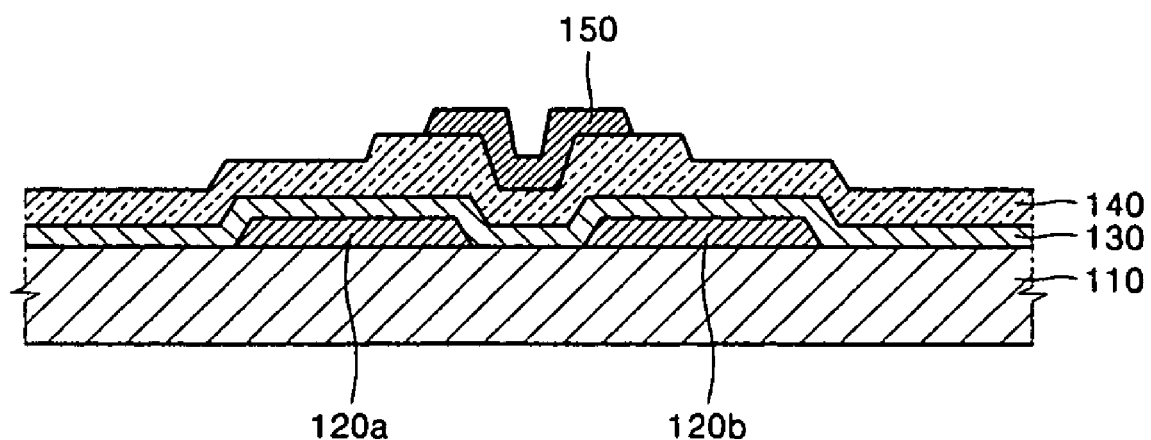

After the second gate insulator 140b is patterned, referring to FIG. 2F, the gate electrode 150 is formed above at least the channel region of the organic semiconductor layer 130. The gate electrode 150 may be composed of a metal material, such as Al, Mo, W, Au, Cr, or the like; a conducting polymer material, or the like.

Figure 3:
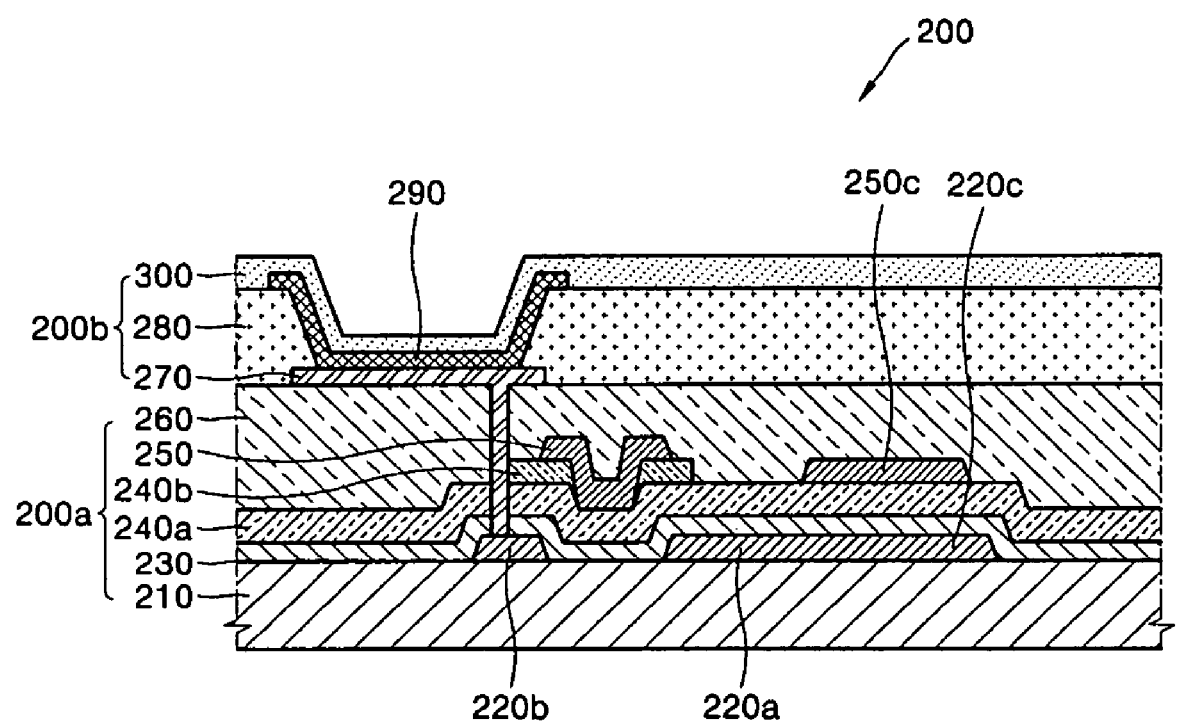
FIG. 3 is a sectional view of an organic electroluminescent display device according to another embodiment.

An organic thin film transistor having the above-mentioned structure can be used to form various display devices. FIG. 3 is a sectional view of an organic electroluminescent display device 200 according to an embodiment of the present invention. The electroluminescent display device 200 is a flat panel display device. In this case, only an organic thin film transistor and a display pixel are illustrated, however, other embodiments are contemplated.

A display region of the electroluminescent display device 200 includes a display region having a pixel unit 200a and an organic thin film transistor layer 200b. The organic thin film transistor layer 200b has a similar structure to that previously discussed Referring to FIG. 3, source and drain electrodes 220a and 220b are formed on a surface of a substrate 210. An organic semiconductor layer 230 covers the source and drain electrodes 220a and 220b. A first gate insulator 240a and a second gate insulator 240b are sequentially formed on the organic semiconductor layer 230. A gate electrode 250 is formed on the second gate insulator 240b. The resulting structure is covered by a planarization layer 260 composed of an insulator. Although the gate electrode 250 is covered by the planarization layer 260 in FIG. 3, an inorganic insulator (not shown) can be further formed between the gate electrode 250 and the planarization layer 260.

A lower electrode 220c of a capacitor is connected to the source electrode 220a, and the capacitor further includes an upper electrode 250c.

A first electrode layer 270, which acts as an anode, is formed on a surface of the planarization layer 260. The first electrode layer 270 is electrically connected to the drain electrode 220b through a via hole formed in the first gate insulator 240a, the second gate insulator 240b, and the planarization layer 260.

The first electrode layer 270 may have various structures. If the organic electroluminescent display device 200 is a front emission electroluminescent display device, the first electrode layer 270 may include a refection electrode and a transparent electrode formed thereon. The reflection electrode may be composed of Ag, Mg, Al, Pt, Pd, Au, Ni, Nd, Ir, Cr, or a combination of these. If the organic electroluminescent display device 200 is a rear emission electroluminescent display device, the first electrode layer 270 may be a transparent electrode composed of a transparent conducting material, such as ITO, IZO, ZnO, or $In_2O_3$. Although the first electrode 270 is a single layer or a double layer in some embodiments, the first electrode 270 can include more than two layers.

A pixel defining layer 280 is formed on the planarization layer 260. The pixel defining layer 280 has a pixel opening through which light can be emitted from the first electrode 270. An organic electroluminescent emission unit 290 is formed on the first electrode layer 270.

The organic electroluminescent emission unit 290 may include a low molecular weight organic layer or a polymer organic layer. The low molecular weight organic layer may be a hole injection layer (HIL), a hole transport layer (HTL), an organic emission layer (EML), an electron transport layer (ETL), an electron injection layer (EIL), a combination of these, or the like. The organic layer may be composed of copper phthalocyanine (CuPc), N,N'-di(naphthalene-1-yl)-N,N'-diphenyl-benzidine (NPB), tris-8-hydroxyquinoline aluminum (Alq3), or the like. Vacuum deposition or other methods can be used to form the organic layer.

The polymer organic layer may include an HTL and an EML. The HTL may be composed of PEDOT, and the EML may be composed of a polymer containing Poly-Phenylenevinylene (PPV), a polyfluorene-containing polymer, or the like. Screen printing, inkjet printing, or the like can be used to form the polymer organic layer. Other methods can be used to form the organic electroluminescent emission unit 290.

Similarly, a second electrode layer 300 acting as a cathode can have various structures according to at least the polarity of the electrode layer and the type of the organic electroluminescent display device 200. That is, if the organic electroluminescent display device 200 is a rear emission electroluminescent display device, the second electrode layer 300 may be formed by forming an electrode for adjusting the work function thereof composed of Li, Ca, LiF/Ca, LiF/Al, Al, Ag, Mg, or a combination of these on a surface of the organic electroluminescent emission unit 290 and then forming a transparent electrode of ITO, IZO, ZnO, $In_2O_3$, or the like on the electrode. If the organic electroluminescent display device 200 is a rear emission electroluminescent display device, the second electrode layer 300 acting as a cathode may include at least a layer composed of a low work function material, such as Li, Ca, LiF/Ca, LiF/Al, Al, Ag, Mg, or a combination of these. The second electrode layer 300 may cover the entire substrate, but is not limited to this structure. In one embodiment, the first electrode layer 270 acts as an anode and the second electrode layer 300 acts as a cathode. However, the first electrode layer 270 can act as a cathode and the second electrode layer 300 can act as an anode.

Additionally, a display region including the organic thin film transistor layer 200a and the pixel unit 200b formed on the substrate 210 may be sealed by a sealing element (not shown). The sealing structure may vary. For example, a sealing substrate may be formed on the second electrode layer 300 such that at least the display region 200 is sealed. Alternatively, a sealing film layer including at least one layer can be formed on a surface of the second electrode layer 300.

The embodiments of organic thin film transistor described herein and other embodiments can also be used in liquid crystal display devices as well, and to form driver circuits and other digital and/or analog circuitry.

The above embodiments are not intended to limit the scope of the present invention, and various changes in form and details may be made therein without departing from the spirit and scope of the present.

The embodiments described here in have at least the following advantages.

Poor performance related to cross-talk between adjacent transistors is reduced.

There are certain manufacturing advantages as well. A photo-resist pattern, in particular, a negative photo-resist pattern, may be used to form an insulating through unit from an insulator formed on the organic semiconductor layer. Therefore, the manufacturing process can be simplified, high resolution can be obtained, and adhesiveness between the insulator and the underlying organic semiconductor layer increases. These advantages contribute to lower manufacturing costs and higher performance.

Additionally, malfunctioning of pixels of the flat display device including the organic thin film transistor can be reduced, thereby improving the quality of the flat display device increases.

Furthermore, higher gain of the transistor can be achieved by a desired increased capacitance between the gate and the channel, without suffering the consequences of an undesired higher capacitance between the gate and both the drain and the source.

While the above description has pointed out novel features of the invention as applied to various embodiments, the skilled person will understand that various omissions, substitutions, and changes in the form and details of the device or process illustrated may be made without departing from the scope of the invention. Therefore, the scope of the invention is defined by the appended claims rather than by the foregoing description. All variations coming within the meaning and range of equivalency of the claims are embraced within their scope.

What is claimed is:

1. A thin film transistor comprising:
source and drain electrodes and an semiconductor layer formed on a substrate, the semiconductor layer comprising a channel region between the source and drain electrodes;
a gate electrode insulated from the source and drain electrodes and the semiconductor layer; and
a gate insulator having a first portion formed between the gate electrode and each of the source and drain electrodes and having a second portion formed between the gate electrode and the channel region of the semiconductor layer, wherein the thickness of the first portion of the gate insulator where the gate electrode overlaps each of the source and drain electrodes is greater than the thickness of the second portion of the gate insulator where the gate electrode overlaps the channel region of the semiconductor layer, wherein the first portion comprises a plurality of layers, and at least one of the layers comprises a discontinuity near the gate electrode.

2. The thin film transistor of claim 1, wherein the gate insulator comprises a layer composed of at least a compound selected from the group consisting of $SiO_2$, SiNx, $Al_2O_3$, $Ta_2O_5$, BST, PZT, poly methylmethacrylate (PMMA), polystyrene (PS), phenol-containing polymers, acryl-containing polymers, imide-containing polymers including polyimide, arylether-containing polymers, amide-containing polymers, fluorine-containing polymers, polymers containing p-xylene, vinyl alcohol-containing polymers, and parylene.

3. The thin film transistor of claim 1, wherein the semiconductor layer is composed of at least a compound selected from the group consisting of pentacene, tetracene, anthracene, naphthalene, α-6-thiophene, perylene and derivatives thereof, rubrene and derivatives thereof, coronene and derivatives thereof, perylenetetracarboxylic diimide and derivatives thereof, perylenetetracarboxylic dianhydride and derivatives thereof, polythiophene and derivatives thereof, polyparaphenylenevinylene and derivatives thereof, polyparaphenylene and derivatives thereof, polyfluorene and derivatives thereof, polythiophenevinylene and derivatives thereof, polythiophene-heteroaromatic ring copolymer and derivatives thereof, oligoacene of naphthalene and derivatives thereof, oligothiophene of α-5-thiophene and derivatives thereof, a metal-containing phthalocyanine or metal-free phthalocyanine and derivatives thereof, pyromellitic dianhydride and derivatives thereof, pyromellitic diimide and derivatives thereof, perylenetetracarboxylic acid dianhydride and derivatives thereof, perylenetetracarboxylic diimide and derivatives thereof, naphthalene tetracarboxylic acid diimide and derivatives thereof, and naphthalene tetracarboxylic acid dianhydride and derivatives thereof.

4. The thin film transistor of claim 1, wherein at least a portion of the gate insulator is tapered.

5. The thin film transistor of claim 1, wherein the source and drain electrodes each form an ohmic-contact with the semiconductor layer.

6. The thin film transistor of claim 5, wherein the source and drain electrodes are composed of at least an element selected from the group consisting of Au, Au/Ti, Au/Cr, Pt, Pt/Pd, and Ni.

7. A flat display device comprising:
a substrate having a display region;
a thin film transistor; and
a pixel layer formed on the display region, the thin film transistor comprising:
source and drain electrodes and a semiconductor layer formed on a substrate, the semiconductor layer comprising a channel region between the source and drain electrodes;
a gate electrode insulated from the source and drain electrodes and the semiconductor layer; and
a gate insulator having a first portion formed between the gate electrode and each of the source and drain electrodes and having a second portion formed between the gate electrode and the channel region of the semiconductor layer,
wherein the thickness of the first portion of the gate insulator where the gate electrode overlaps each of the source and drain electrodes is greater than the thickness of the second portion of the gate insulator where the gate electrode overlaps the channel region of the semiconductor layer, wherein the first portion comprises a plurality of layers, and at least one of the layers comprises a discontinuity near the gate electrode.

8. The flat display device of claim 7, wherein the gate insulator comprises at least a layer composed of at least a compound selected from the group consisting of $SiO_2$, SiNx, $Al_2O_3$, $Ta_2O_5$, BST, PZT, poly methylmethacrylate (PMMA), polystyrene (PS), phenol-containing polymers, acryl-containing polymers, imide-containing polymers, arylether-containing polymers, amide-containing polymers, fluorine-containing polymers, polymers containing p-xylene, vinyl alcohol-containing polymers, and parylene.

9. The flat display device of claim 7, wherein the semiconductor layer is composed of at least a compound selected from the group consisting of pentacene, tetracene, anthracene, naphthalene, α-6-thiophene, perylene and derivatives thereof, rubrene and derivatives thereof, coronene and derivatives thereof, perylenetetracarboxylic diimide and derivatives thereof, perylenetetracarboxylic dianhydride and derivatives thereof, polythiophene and derivatives thereof, polyparaphenylenevinylene and derivatives thereof, polyparaphenylene and derivatives thereof, polyfluorene and derivatives thereof, polythiophenevinylene and derivatives thereof, polythiophene-heteroaromatic ring copolymer and derivatives thereof, oligoacene of naphthalene and derivatives thereof, oligothiophene of α-5-thiophene and derivatives thereof, a metal-containing phthalocyanine or metal-free phthalocyanine and derivatives thereof, pyromellitic dianhydride and derivatives thereof, pyromellitic diimide and derivatives thereof, perylenetetracarboxylic acid dianhydride and derivatives thereof, perylenetetracarboxylic diimide and derivatives thereof, naphthalene tetracarboxylic acid diimide and derivatives thereof, and naphthalene tetracarboxylic acid dianhydride and derivatives thereof.

10. The flat display device of claim 7, wherein at least a portion of the gate insulator is tapered.

11. The flat display device of claim 7, wherein the source and drain electrodes each form an ohmic-contact with the semiconductor layer.

12. The flat display device of claim 11, wherein the source and drain electrodes are composed of at least an element selected from the group consisting of Au, Au/Ti, Au/Cr, Pt, Pt/Pd, and Ni.

13. A method of manufacturing a thin film transistor, the method comprising:
    forming source and drain electrodes on a substrate;
    forming above the source and drain electrodes a semiconductor layer comprising a channel region between the source and drain electrodes;
    forming a first gate insulator above the semiconductor layer;
    forming a second gate insulator on substantially an entire upper surface of the first gate insulator;
    removing at least a portion of the second gate insulator above the channel region of the semiconductor layer; and
    forming a gate electrode above the channel region and at least a portion of each of the drain and source electrodes,
    wherein the thickness of the second gate insulator where the gate electrode overlaps each of the source and drain electrodes is greater than the thickness of the second gate insulator where the gate electrode overlaps the channel region.

14. The method of claim 13, wherein removing at least a portion of the second gate insulator comprises using a laser beam.

15. The method of claim 13, wherein removing at least a portion of the second gate insulator comprises masking and etching.

16. A method of manufacturing a thin film transistor, the method comprising:
    forming source and drain electrodes above a surface of a substrate;
    forming above the source and drain electrodes a semiconductor layer comprising a channel region between the source and drain electrodes;
    forming a gate insulator on substantially an entire surface of the semiconductor layer;
    removing at least a portion of the gate insulator above the channel region; and
    forming a gate electrode above at least the channel region and at least a portion of each of the drain and source electrodes,
    wherein the thickness of a first portion of the gate insulator where the gate electrode overlaps each of the source and drain electrodes is greater than the thickness of a second portion of the gate insulator where the gate electrode overlaps the channel region.

17. The method of claim 16, wherein removing at least a portion of the gate insulator comprises using a laser beam.

18. The method of claim 16, wherein removing at least a portion of the gate insulator comprises masking and etching.

* * * * *

UNITED STATES PATENT AND TRADEMARK OFFICE
CERTIFICATE OF CORRECTION

PATENT NO.       : 7,288,818 B2
APPLICATION NO.  : 11/230293
DATED            : October 30, 2007
INVENTOR(S)      : Lee et al.

It is certified that error appears in the above-identified patent and that said Letters Patent is hereby corrected as shown below:

In Column 2, Line 59, please delete "polyflorene" and insert -- polyfluorene --, therefor.

In Column 2, Line 65, please delete "pyromelitic" and insert -- pyromellitic --, therefor.

In Column 2, Line 66, please delete "pyromelitic" and insert -- pyromellitic --, therefor.

In Column 3, Line 44, please delete "polyflorene" and insert -- polyfluorene --, therefor.

In Column 3, Line 50, please delete "pyromelitic" and insert -- pyromellitic --, therefor.

In Column 3, Line 51, please delete "pyromelitic" and insert -- pyromellitic --, therefor.

In Column 3, Line 58, please delete "a" after "to."

In Column 5, Line 2, please delete "propinonate" and insert -- propionate --, therefor.

In Column 5, Line 22, please delete "polyflorene" and insert -- polyfluorene --, therefor.

In Column 5, Line 28, please delete "pyromelitic" and insert -- pyromellitic --, therefor.

UNITED STATES PATENT AND TRADEMARK OFFICE
CERTIFICATE OF CORRECTION

PATENT NO. : 7,288,818 B2
APPLICATION NO. : 11/230293
DATED : October 30, 2007
INVENTOR(S) : Lee et al.

It is certified that error appears in the above-identified patent and that said Letters Patent is hereby corrected as shown below:

In Column 5, Line 29, please delete "pyromelitic" and insert -- pyromellitic --, therefor.

Signed and Sealed this

Twenty-second Day of July, 2008

JON W. DUDAS
*Director of the United States Patent and Trademark Office*